United States Patent
Zhu et al.

(10) Patent No.: US 9,601,191 B2
(45) Date of Patent: Mar. 21, 2017

(54) EXPLOITING PHASE-CHANGE MEMORY WRITE ASYMMETRIES TO ACCELERATE WRITE

(71) Applicant: UNIVERSITY OF MAINE SYSTEM BOARD OF TRUSTEES, Bangor, ME (US)

(72) Inventors: Yifeng Zhu, Orono, ME (US); Jianhui Yue, Old Town, ME (US)

(73) Assignee: UNIVERSITY OF MAINE SYSTEM BOARD OF TRUSTEES, Bangor, ME (US)

( * ) Notice: Subject to any disclaimer, the term of this patent is extended or adjusted under 35 U.S.C. 154(b) by 0 days.

(21) Appl. No.: 14/759,085

(22) PCT Filed: Dec. 20, 2013

(86) PCT No.: PCT/US2013/076913
§ 371 (c)(1),
(2) Date: Jul. 2, 2015

(87) PCT Pub. No.: WO2014/107335
PCT Pub. Date: Jul. 10, 2014

(65) Prior Publication Data
US 2015/0340091 A1    Nov. 26, 2015

Related U.S. Application Data

(60) Provisional application No. 61/749,041, filed on Jan. 4, 2013.

(51) Int. Cl.
G11C 11/00    (2006.01)
G11C 13/00    (2006.01)

(52) U.S. Cl.
CPC ...... *G11C 13/0004* (2013.01); *G11C 13/0061* (2013.01); *G11C 13/0069* (2013.01);
(Continued)

(58) Field of Classification Search
CPC ............ G11C 13/0004; G11C 13/0061; G11C 13/0069; G11C 2211/5647; G11C 2211/5642
(Continued)

(56) References Cited

U.S. PATENT DOCUMENTS

2004/0225829 A1    11/2004    Akiyama et al.
2008/0253191 A1*   10/2008    Kang ............... G11C 16/20
                                                    365/185.18
(Continued)

*Primary Examiner* — Tha-O H Bui
(74) *Attorney, Agent, or Firm* — Choate, Hall & Stewart LLP; William R. Haulbrook

(57) ABSTRACT

To improve the write performance of PCM, the disclosed technology, in certain embodiments, provides a new write scheme, referred to herein as two-stage-write, which leverages the speed and power asymmetries of writing a zero bit and a one bit. Writing a data block to PCM is divided into two separated stages, i.e., write-0 stage and write-1 stage. Without violating power constraints, during the write-0 stage, all zero bits in this data block are written to PCM at an accelerated speed; during the write-1 stage, all one bits are written to PCM, with more bits being written concurrently. In certain embodiments, the disclosed technology provides a new coding scheme to improve the speed of the write-1 stage by further increasing the number of bits that can be written to PCM in parallel.

13 Claims, 14 Drawing Sheets

(52) U.S. Cl.
    CPC .............. *G11C 2211/5642* (2013.01); *G11C 2211/5647* (2013.01)

(58) Field of Classification Search
    USPC .............................. 365/49.13, 65, 117, 163
    See application file for complete search history.

(56) References Cited

U.S. PATENT DOCUMENTS

| | | |
|---|---|---|
| 2009/0067227 A1 | 3/2009 | Kang et al. |
| 2009/0147566 A1 | 6/2009 | Lin et al. |
| 2011/0029723 A1* | 2/2011 | Lee .............. G06K 19/07732 711/103 |
| 2011/0197017 A1 | 8/2011 | Yu et al. |

* cited by examiner

Figure 9: Two-stage-write Read Latency Reduction

Figure 10: Two-stage-write Running Time Reduction

Figure 11: Read Latency Reduction of Two-stage Write with In-version

Figure 12: Running Time Reduction of Two-stage Write with Inversion

EXPLOITING PHASE-CHANGE MEMORY WRITE ASYMMETRIES TO ACCELERATE WRITE

GOVERNMENT SUPPORT

This invention was made with government support under 1117032, 0916663, 0937988 awarded by the National Science Foundation. The Federal Government has certain rights in the invention.

BACKGROUND

In the near future, exascale computing will expect 1000× more memory capacity than available today. However, today's DRAM technology is hitting the wall of energy efficiency and transistor scaling. It is a great challenge to fabricate high density DRAM beyond 22 nm due to difficulties such as efficient charge placement and control of the capacitor, and reliable charge sensing in DRAM. In addition, energy consumption and heat dissipation of DRAM with such a large capacity is a severe issue. In current generation of technology, DRAM power consumption can reach 40% of the server energy consumption. In fact, the idle power consumption of DRAM accounts for more than 40% of the DRAM power usage. In addition, DRAM's leakage of power increases with its capacity and this leakage power can be as much as its dynamic power.

Fortunately, phase-change memory (PCM) has better process scalability and less leakage power. The PCM technology is capable of transforming the Ge2Sb2Te5(GST) material properties to exhibit various resistances in response to heat produced by varying levels of currents. In addition, PCM consumes less leakage current and requires no refresh operations due to its non-volatile property. These attractive properties make the PCM a good alternative to the DRAM for exascale computing in the near future.

However, PCM typically has two major weaknesses: slow write performance and weak write endurance. A PCM chip circuit often limits the maximum instantaneous power due to noise minimization, and hence the number of bits that can be concurrently written is limited to a predefined constant N. Typical value of N is 2, 4, 8 and 16. This constraint limits the number of bytes that can be written to a bank simultaneously, which is referred to as a write unit. Accordingly, writing a cache line of 64 bytes needs multiple serially executed write units, which slows down the overall write performance. Besides slow write, a PCM cell endures around $10^8$-$10^{10}$ write cycles while a DRAM cell can support over $10^{15}$ writes.

SUMMARY

The disclosed technology, in certain embodiments, provides a new PCM write scheme, referred to herein as Two-Stage Write, which leverages the asymmetric properties for writing bit 1 and bit 0 to speed up the write operations of zero bits and increase the degree of parallelism for writing one bits. In certain embodiments, the disclosed technology separates the write process of a cache line into two separated stages: one that writes all bits of one in the target cache line (write-1 stage) and the other that writes all bits of zero (write-0 stage). Since writing a bit of zero is much faster than writing a bit of one, all writes in the write-0 stage can be performed at an accelerated speed. In the write-1 stage, since writing a bit of one takes much less electric current than writing a bit of zero, more PCM cells can be written concurrently to increase the degree of write parallelism without violating any instantaneous power constraints. Compared with conventional writing schemes in PCM, two-stage write can achieve better resource utilization and reduce the service time for writing a cache line.

The disclosed technology, in certain embodiments, includes a phase-change memory (PCM) chip comprising a circuit, wherein the circuit includes: a buffer, the buffer configured to store one or more bits and to output a buffer signal; a finite states machine (FSM), the FSM configured to provide an output control, a first write-region control, and a second write-region control, wherein the first and second write-region controls specify which write-region is scheduled; a first AND gate, the first AND gate configured to receive the output control, the first write-region control, and an inverted buffer signal, wherein the inverted buffer signal is an inversion of the buffer signal output by the buffer; a second AND gate, wherein the second AND gate receives the buffer signal, the second write-region control, and an inversion of the output control; an OR gate, wherein the OR gate is configured to receive an output signal of the first AND gate and an output signal of the second AND gate; and a switch, the switch configured to provide the buffer signal to a write driver according to an output signal of the OR gate, wherein the write driver writes one or more bits stored in the buffer in the target cache line; wherein the circuit is configured to schedule writing requests in at least two stages, wherein a first stage comprises writing all bits of zero in a target cache line and a second stage comprises writing all bits of one in the target cache line. In certain embodiments, the first stage precedes the second stage.

In another aspect of the disclosed technology, in certain embodiments, the PCM chip includes a control circuit, wherein the control circuit is configured to: identify a number of ones in a write unit to be written in the target cache line, determine that the number of ones in the write unit exceeds half of the write unit size; based on the determining step, (a) invert all of the bits in the write unit, and (b) store an inversion flag associated with the write unit; wherein the bits are inverted and the inversion flag is associated prior to the first stage and the second stage. In certain embodiments, the first stage comprises writing the bits of zero sequentially. In certain embodiments, the second stage comprises writing one or more bits of one in parallel. In certain embodiments, the circuit comprises the control circuit. In certain embodiments, the PCM chip is a single-level-cell (SLC) chip.

In another aspect of the disclosed technology, a phase-change memory (PCM) chip includes a circuit, the circuit configured to schedule writing requests in at least two stages, wherein a first stage of the at least two stages comprises writing all bits of zero in a target cache line and a second stage of the at least two stages comprises writing all bits of one in the target cache line. In certain embodiments, the first stage precedes the second stage.

In another aspect of the disclosed technology, in certain embodiments, the PCM chip includes a control circuit, wherein the control circuit is configured to: identify a number of ones in a write unit to be written in the target cache line; determine if the number of ones in the write unit exceeds half of the write unit size; and based upon the determining step, (a) invert all of the bits in the write unit, and (b) store an inversion flag associated with the write unit; wherein the bits are inverted and the inversion flag is associated prior to the first stage and the second stage. In certain embodiments, the first stage comprises writing the bits of zero sequentially. In certain embodiments, the second stage comprises writing one or more bits of one in parallel. In certain embodiments, the circuit comprises the control circuit. In certain embodiments, the PCM chip is a single-level-cell (SLC) chip.

BRIEF DESCRIPTION OF THE FIGURES

The foregoing and other objects, aspects, features, and advantages of the present disclosure will become more apparent and better understood by referring to the following description taken in conjunction with the accompanying drawings, in which.

Figure 1:
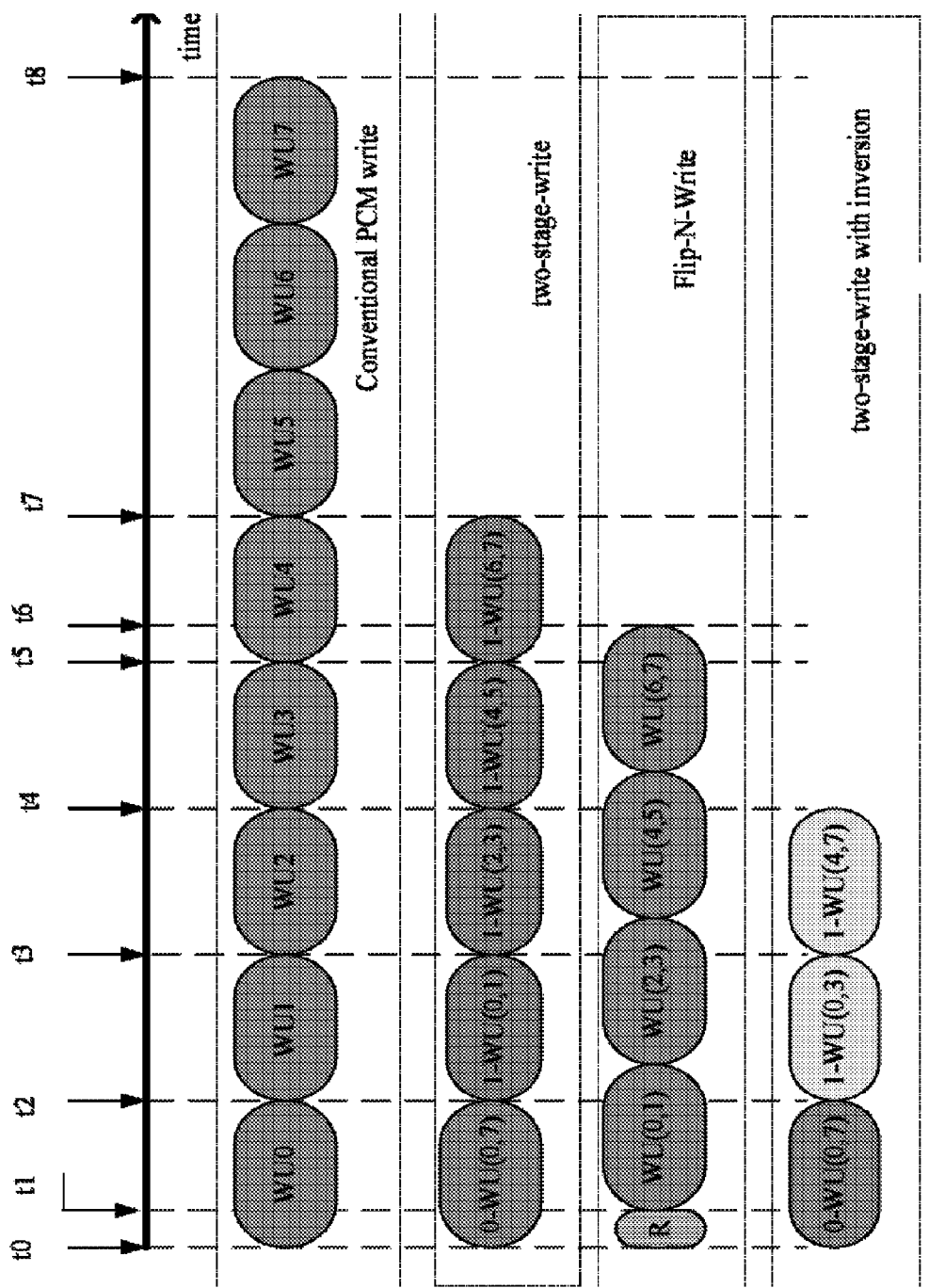
FIG. 1 is an illustration of a difference between Flip-N-Write and Two-Stage-Write-Inv.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

Applying various amount of electrical current to a PCM cell can make the cell have different resistance. This property is used to store various digital information in a PCM cell. A Single-Level-Cell (SLC) cell can store a single bit of data, and a Multiple-Level-Cell (MLC) can store multiple bits. The high storage density of MLC is at the cost of lower access speed. The disclosed technology may be applied to both SLC PCM and MLC PCM. In a SLC PCM, the response time and power requirement of writing a bit of zero and a bit of one to a cell are very different. Writing a bit of zero takes a much shorter time but requires a much larger electric current compared to writing a bit of one. Conventional PCM system is very conservative in scheduling write requests. It assumes that (1) the response time of writing to a cell is as much as required to write a bit of one and (2) the electric current of writing a cell is as large as required to write a bit of zero. When writing a data block with a mix of ones and zeros, the write bandwidth is degraded due to unnecessary blocking caused by the unbalanced response time of writing ones and zeros, and wasted parallelism caused by under-utilization of power budget.

FIG. 1 uses a simple example to highlight a difference between the conventional PCM write scheme and a Two-Stage Write of the disclosed technology. Assume a cache line has 8 write units, i.e., it requires eight writes to store a cache line. Under the conventional scheme, each write unit completes after a service time of writing a bit of one, regardless of the actual values written. The conventional scheme would complete eight write units serially at the time instant $t_8$. In Two-Stage Write, on the other hand, all zero bits are written to PCM cells at a faster speed and the write-0 stage completes at the time instant $t_2$. During the following write-1 stage, the lower current requirement of writing a bit of one enables more one bits to be written concurrently under the same power budget. As a result, the number of serial writes in the write-1 stage is reduced. Two-Stage Write completes at time $t_7$.

In Two-Stage Write, in certain embodiments, an accurate estimation of write current requirements is made. In certain embodiments, since in each stage, all bits to be written have the same value, each bit takes the same amount of electric current. Thus the total current required can be easily calculated. In certain embodiments, not all bits of a data block to be written are the same. As a result, the disclosed technology considers bits with a value of x at the write-x stage. In this way, an accurate estimation of write current requirement for each write can be made.

The disclosed technology, in certain embodiments, includes a Flip-or-Not-Flip coding scheme to further improve the performance of the write-1 stage. The purpose is to guarantee that the number of bits with the specified value, k, in each data block is no larger than half of the size of this data block. For example, assuming k is 1, this coding scheme examines whether the number of 1s is greater than the number of zeros in a data block. If yes, it flips all bits of this data block. In this way, the number of ones does not exceed half of the data block size. Under the same instantaneous current constraints, this coding scheme can double the number of ones that can be written concurrently to PCM cells, comparing with conventional schemes. Since the write-1 stage dominates the response time of writing a cache line, in certain embodiments, this coding scheme to the write-1 stage. This write scheme is referred to as the Two-Stage-Write-Inversion. This writing scheme does not need to compare against old data and thus does not have the overhead of reading old data.

FIG. 1 illustrates the difference between Flip-N-Write and To-Stage-Write-Inv. Flip-N-Write completes reading old data at time t1. After comparing the old data and its flipped data, Flip-N-Write can reduce the number of bits to be written by half of the data block size, which makes two write units are concurrently processed without violating power budget. Flip-N-Write's write finishes at time t6. In Two-Stage-Write-Inv, the write-0 stage finishes at time t2, which is the same as Two-Stage-Write. Through selective inversion, the write-1 stage reduces the number of bits to be written by half and each time it writes twice the amount of data in the two-stage-write. Accordingly, the write-1 stage in Two-Stage-Write-Inv finishes earlier at time t4.

Figure 2:
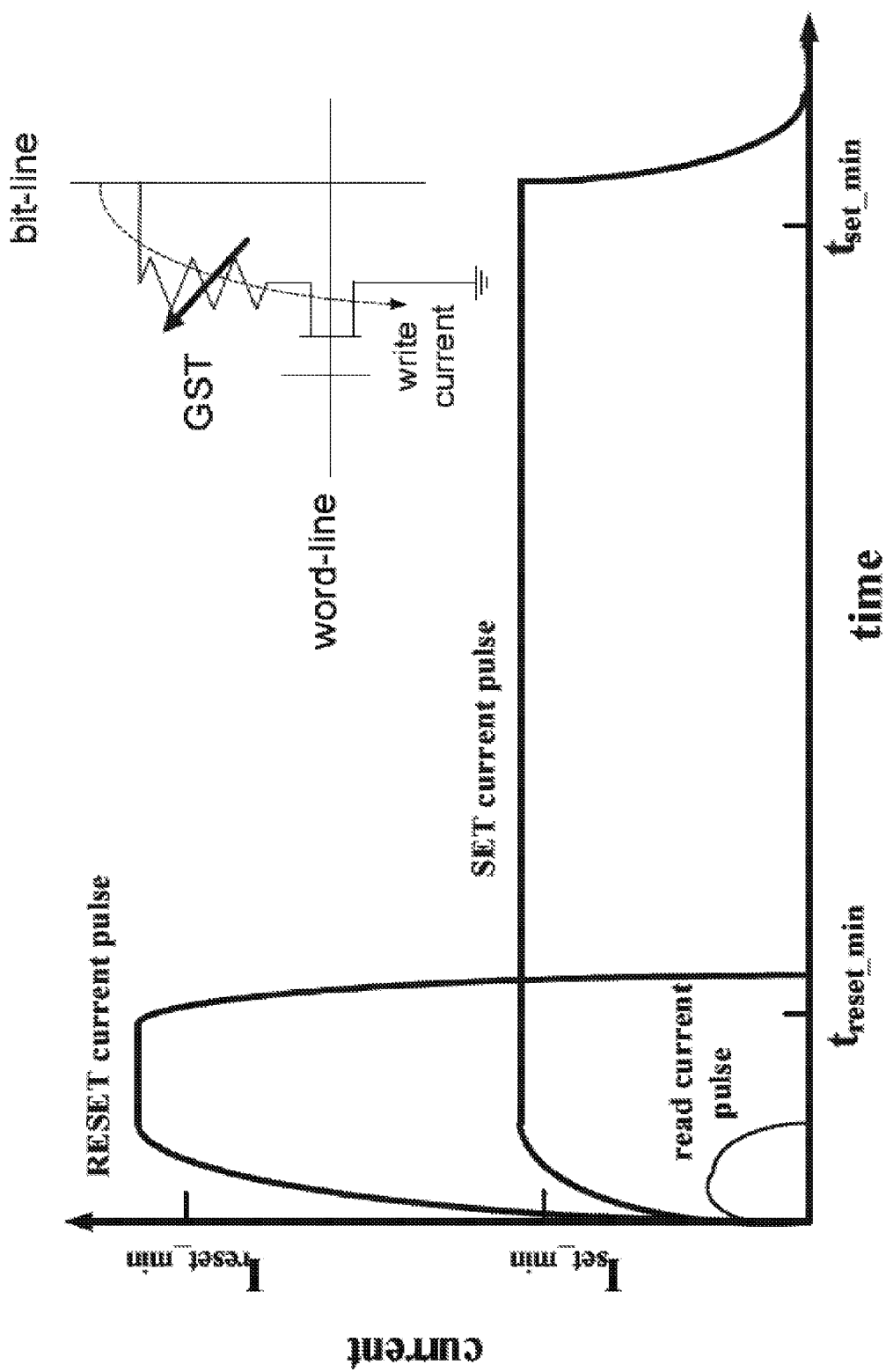
FIG. 2 is an illustration of an example PCM circuit and performance chart.

Phase Change Memory (PCM) is a one-transistor, one-resistor (1T1R) device shown in FIG. 2, while DRAM is a one-transistor, one-capacitor (1T1C) device. PCM exploits remarkably different properties of phase change material in a memory cell to store digital information. Phase change material, such as Ge2Sb2Te5(GST), has two phases: an amorphous phase that has a high resistance in the M Ωs range and a crystalline phase that has lower resistance in the K Ωs range. PCM uses the different resistances associated with the different portions of GST in the amorphous state to represent digital information. By exploiting the large range of resistances, a PCM cell can store multiple bits of data and form the multiple-level-cell (MLC). On the other hand, a cell storing a single bit of information is a single-level-cell (SLC). However, due to process variation, it is hard to apply accurate current to induce the GST to the target resistance due to narrow spaces between the neighboring storage locations. The PCM being written to tries different current values until it reaches the target resistance. The larger the number of bits stored in a cell, the greater the number of write attempts. This makes the MLC slower than SLC.

Reading a PCM cell is accomplished by sensing the current flow from the storage location, which is determined by the resistance of the cell. Write latency of PCM is much larger than its read latency since GST needs to be heated up to change its phase, as shown in FIG. 2.

Writing a bit of 0 and a bit of 1 to a PCM cell exhibit large differences in terms of write current and time. When bit 0 is written, a large current is applied to the cell for a short duration in order to heat the GST abruptly and move it to the amorphous phase. On the other hand, if bit 1 is written, a relatively smaller current is applied to the cell for a longer duration. This induces lower heat in the GST, and the GST remains in the crystalline phase. Besides the difference in write currents, writing bit 1 takes a longer time than writing bit 0. Writing bit 0 results in a process that changes the GST to have high resistance. The large current can easily achieve the high resistance in face of process variation. However, writing bit 1 is more challenging than write bit 0 when process variations are considered. In high density PCM cells, it is hard to control variations of cells during the PCM fabrication process, which makes it almost impossible to precisely program a PCM cell. Typically a programming-verify (PV) technique is used in industry and academic research. The micro-controller in the PCM heuristically chooses an initial programming pulse for the cell. After programming, the micro-controller reads this cell's resistance and compares it against the target resistance. If the cell does not reach the target resistance, a different pulse is tried. This process repeats until the cell achieves the target resistance. Such multiple iterations of verification further increases write latency. This is one reason why writing bit 1 is longer than bit 0.

Since bit 0s and 1s are non-deterministically distributed among the memory cells, the memory controller chooses the slowest time, i.e., the time to write bit 1, as the required waiting time after writing a bit. Meanwhile, the conventional PCM also conservatively assumes writing any bit needs the same amount of current as writing bit 0.

The write performance is also limited by the electronic circuit's constraints inside a PCM chip. As discussed previously, writing a bit of zero needs a large amount of electric current to heat GST. On a write, the bit line is raised to a voltage higher than the phase change voltage, typically ranging from Vdd+1 to Vdd+3, which results in a higher power draw. In some implementations, a Dickson charge pump, widely used inside the PCM chip, provides the current to the write driver. The noises on the power line hinders the charge pump from providing the high level of instantaneous current needed for writing PCM cells inside a chip. In addition, the poor efficiency of the charge pump further limits parallel writes. This limitation of current provision constrains the number of concurrent writes bits to 2, 4, and 8 in a chip. This writing scheme, referred to as write division mode, results in increased time to write large data. For example, writing 16 bits to a PCM chip takes 8, 4 and 2 time units when writing under ×2, ×4 and ×8 write division mode, respectively. Conventional write scheme conservatively assumes that each bit of a data block to be written is a current-consuming bit (i.e., bit 0) and thus it often overestimates the electric current requirement to write a data block. This conservative estimate results in a loss of opportunity to write more data in one write operation. The disclosed technology improves PCM write performance under the same current delivery capacity as the conventional PCM write scheme.

Writing a zero-bit and a one-bit to a PCM cell have distinct time and electric current requirements. Comparing with writing bit 1, writing bit 0 takes a much larger electric current to heat GST but for a shorter amount of time. The maximum instantaneous electric current that a PCM chip can provide often limits the number of bits that can be concurrently written to a PCM chip. When writing a data block with a mix of zeros and ones into PCM cells concurrently, conventional PCM controller has to wait for the completion of the last bit. Thus the PCM controller cannot issue an outstanding request even though all zero bits of the current write request have been successfully written. In addition, conventional PCM controller always prepares for the worst case instantaneous electric current demand, assuming all written bits are 0. Thus, the number of bits can be concurrently written are fixed to a small number under this assumption. As a result, the system resources tend to be underutilized, leading to inferior write performance.

In some implementations, the disclosed technology provides a two-stage write scheme that fully exploits the asymmetric properties between writing bit 0 and writing bit 1 to solve the under-utilization issue discussed above. When writing a block of data, typically, a cache line, the write scheme takes two steps. In the first step, referred to herein as write-0 stage, all zero bits are written to PCM cells at a high speed. In the second step, referred to herein as write-1 stage, all one bits are written with an increased write unit size. Like the conventional write scheme, the write-0 stage still complies with the parallel write limit and thus writing a cache line needs multiple serial write operations. However, because the write-0 stage is performed at a much faster speed because no one bits are written in this stage. The write-1 stage can write more bits in parallel the conventional PCM write schemes. Writing bit 1 takes less current than writing bit 0 and thus the disclosed technology can increase the size of the write unit without violating instantaneous power constraints, resulting in a less number of serial writes when writing a cache line.

In some implementations, the disclosed technology exclusively write ones and zeros at two separated stages to fully leverage the fact of shorter time required to write a zero bit and less electric current required to write a one bit. In conventional write schemes, ones and zeros are mixed in each write request, and thus the controller has to conservatively limit the number of bits that can be concurrently written to the worst case scenario in which all bits are one, resulting in resources under-utilized. For example, as shown in FIG. 1, writing WU0-WU7 are conservatively set to take the same amount of time under the conventional PCM write. Compared with conventional write schemes, the write scheme can write all zero bits with a faster speed and all one bits with a larger degree of parallelism, under the same power constraints. In this example, the write-0 stage, including 0-WU(0-7), completes at t2 and it performs faster due to shorter time to write zero bits. The write-1 stage, including 1-WU(0-7), can write two data blocks each time due to less power requirement for writing a one bit, thus significantly reducing the overall time to write data block WU(0-7). In the two-stage write, ones and zeros are separated and thus the number of concurrently written bits can be precisely determined in each stage. One advantage of two-stage write is that it can write all zero bits with a tighter schedule and all one bits with a larger write bandwidth. While the extra write-0 stage generates some performance overhead, the accelerated write-1 stage achieves significant performance gain compared with other write schemes. In essence, the 2-stage write trades the larger write unit size for one bits for the shorter write time for zero bits.

The time of writing a cache line in two-stage write and the conventional write scheme can be analyzed as shown below. Assume it takes Treset time to write a zero bit, and Tset time to write a one bit. Writing bit 1 is much slower than writing bit 0, and Tset=K× Treset, where K is the time ratio and is set to 8. Assume the current to write a zero bit is L times of write a one bit, and L is 2. The write unit size is M bytes and a cache line size has N bytes. For simplicity, M=8 and N=64. For simplicity, assume bit 1 and 0 exist in equal probability. Time to write a cache line under conventional write scheme and two-stages-write scheme can be calculated by the following two equations.

$$T_{conventional} = \frac{N}{M} KT_{reset} \quad (1)$$

$$T_{2stages} = \frac{N}{M} T_{reset} + \frac{N}{ML} KT_{reset} \quad (2)$$

$$= \left(\frac{1}{K} + \frac{1}{L}\right) \frac{N}{M} KT_{reset}$$

$$= \left(\frac{1}{K} + \frac{1}{L}\right) T_{conventional}$$

As shown in Eqn. 2, the write-0 stage has N/M serial writes and its total time is N/M Treset. The write-1 stage increases the write unit size by a factor of L. Typically the write-0 stage takes shorter time than the write-1 stage. Suppose the current ratio L is 2 and K is reported to be 8, according to Eqns 1 and 2, $T_{conventional}$=64 Treset and T2 stages=40 $T_{reset}$. This calculation shows that the time of writing a cache line in two-stage-write is only 62.5% of conventional write.

$$speedup = \frac{T_{conventional}}{T_{2stages}} = \frac{1}{\frac{1}{K} + \frac{1}{L}} \quad (3)$$

Eqn. 3 indicates that the speedup of the two-stage write scheme over the conventional scheme is not sensitive to the degree of write division mode but sensitive to the time ratio K and the power ratio L if the write unit size is smaller than a cache line. The increasing degree of write division mode does not affect the speedup, since the speedup is not sensitive to it when the write unit is smaller than a cache line.

Figure 3:
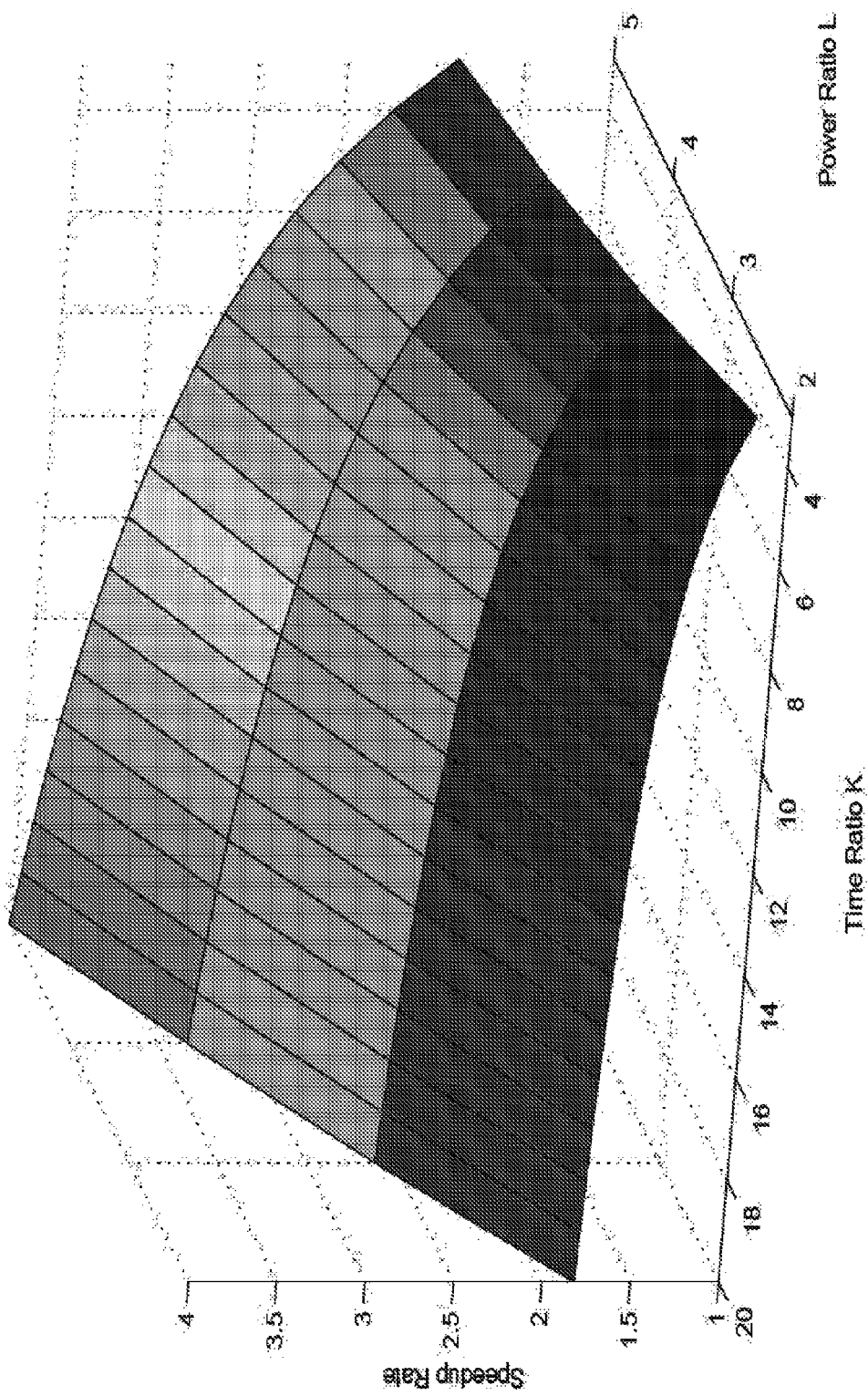
FIG. 3 is an illustration of the speedup of two-stage write compared to a baseline.

FIG. 3 shows the speedup of 2-stage write over the baseline as the time ratio K and the power ratio L vary in representative range. K is typically between 3.75 to 18. L is typically between 2 and 3. As K and L varies under this representative range and the speedup is constantly larger than one.

Two-stage-write is also compared with Flip-N-Write (FNW) as shown below. In Eqn. 4, data needs to be read out first before bit-wise comparison. On average, only half of the bits will be written into PCM cells after comparison. Since $T_{reset}$ is very close to Tread, TFNW=33 $T_{reset}$, which is slightly better than two-stage-write ($T_{2stages}$=40 Treset). Experimental results presented later will show that this writing time gap causes the 4.3% read latency increase and 2.6% performance degradation on average in two-stage-write under various 4-core SPEC 2006 CPU workloads. However, in some implementations, two-stage-write has no overhead of storing data inversion flags used by Flip-N-Write, which needs 6.25% of total PCM storage space in a typical setting.

Figure 4:
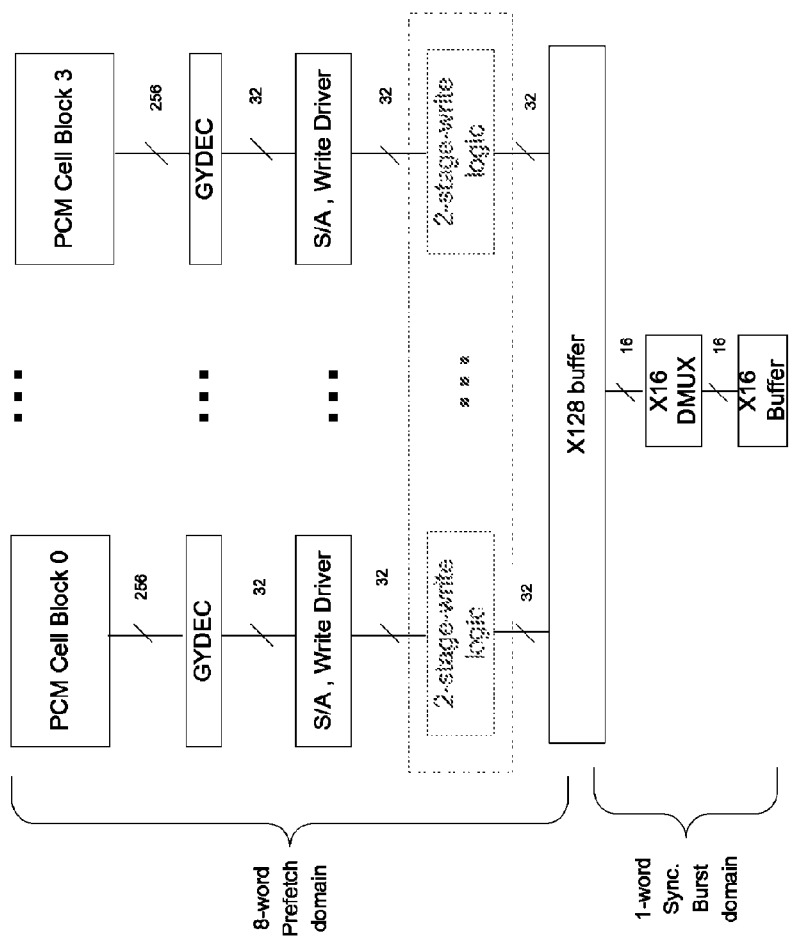
FIG. 4 is an illustration of an example implementation of two-stage-write.

FIG. 4 illustrates an example implementation of two-stage-write based on the product-grade PCM prototype from Samsung, whose data path is illustrated in FIG. 4. This prototype supports eight-word pre-fetch by introducing a buffer for reading request and limits the maximal number of parallel written bits to 16 for each chip. The buffer is connected with multiple sense amplifiers and write drivers. The two-stage-write circuits sit in the data path between the ×128 buffer and these write drivers as shown in FIG. 4. This circuit can write 16 bits of 0 and writing 128 bits needs 8 serial writes in the write-0 stage. If it is assumed that the current ratio between writing bit 0 and bit 1 is 2, two-stage-write can write 32 bits of 1 each time and writing 128 bits only needs 4 serial writes in the write-1 stage. Each serial write has a corresponding region of bits in the buffer, which can be specified by the offset. This region is referred to herein as the write-region.

Figure 5:
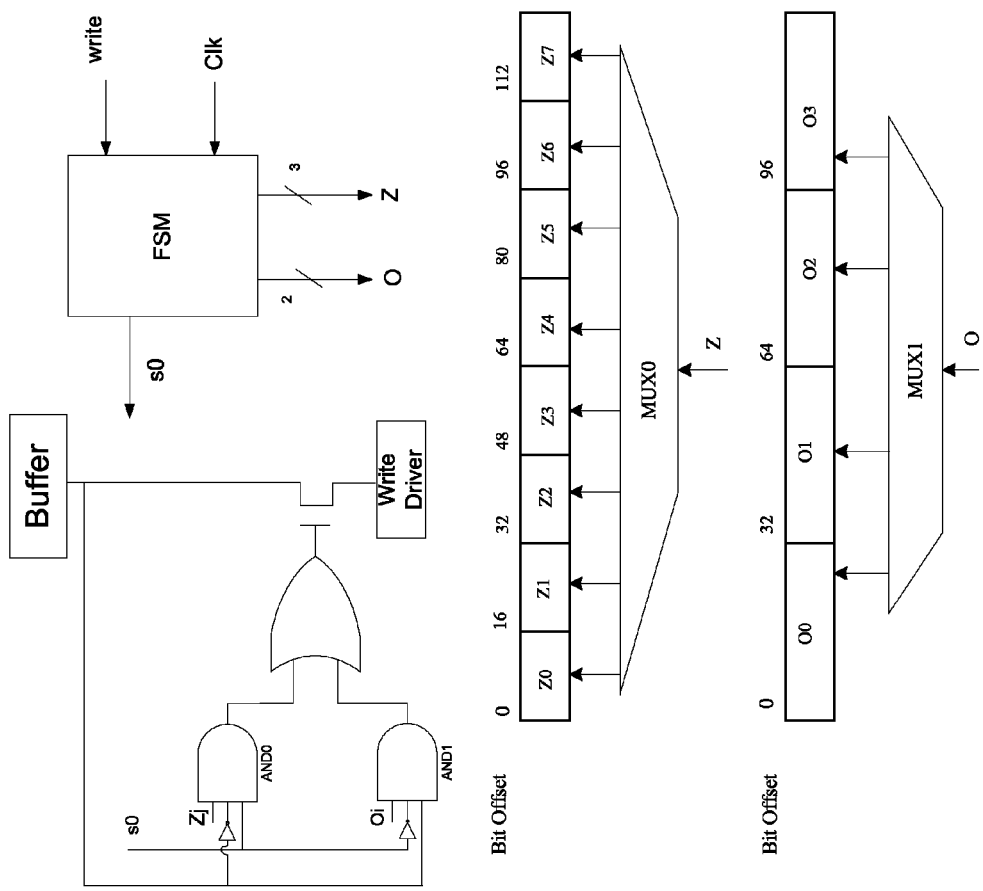
FIG. 5 is an illustration of an example two-stage-write circuit including the individual components for each bit and the common component shared by all bits in the buffer.

The two-stage-write circuit includes the individual component for each bit and the common component shared by all bits in the buffer as shown in FIG. 5. The shared finite states machine (FSM) produces output control signals write-stage (s0), the specified serial write to write bit 0 (Z), and the specified part of buffer to write bit 1 (O). If s0 is 0, the write stage is at the write-0 stage. Otherwise, the write stage is at the write-1 stage. Since each time different write-regions are written at different stages (see FIG. 5), the O and Z produced by the FSM specify which write-region is scheduled respectively at the write-1 stage and write-0 stage. In the disclosed technology, the write-1 stage writes 4 write-regions and write-0 stage writes 8 write-regions. The O signal has 3 bits and the Z signal has 2 bits. Each bit in the buffer is an input of individual component shown in FIG. 5. When the buffer stores bit 0, the write-0 stage signal s0 and the corresponding Zj, which means this buffer belongs to the jth serial write in the stage-0, enables AND0 gate and passes this bit 0 to PCM cell. When the buffer stores bit 1, the write-1 stage signal s0 and the corresponding Oi, which means this buffer belongs to the ith serial write in the stage-1, enables AND0 gate and passes this bit 1 to PCM cell.

In some implementations, the input $Z_j$ and $O_i$ for each bit specify whether this bit is involved in the $j^{th}$ and $i^{th}$ serial write in the write-0 stage and write-1 stage respectively. For example, in some implementations, the first serial write in the write-0 stage involves 16 bits whose offset rages from $0^{th}$ to $15^{th}$ in the buffer under the ×16 write division mode and each bits in the $i^{th}$ write-region in the write-0 stage is associated with its serial writing order Zj as shown in FIG. 5. Since, in some implementations, each PCM has a 128-bit buffer, two-stage-write has 8 serial writes in the write-0 stage. However, in some implementations, the write-1 stage only has 4 serial writes. This is because the writing current for bit 1 is a half the writing current and writing 32 bits with bit 1 can be concurrently written without exceeding current supply budget under the ×16 write division mode. As a result, the first write region in write-1 ranges from 0th to 31st in the buffer as shown in FIG. 5. Since Z and O produced by the FSM can indicate the order of the specified write at different write stage, the MUX0 and MUX1 use Z and O to specify the corresponding part of data in the buffer for the specified write-0 and write-1 operation respectively. Since the write operation is not in the performance critical path, the overhead associated with two-stage-write circuits is negligible. Note that this implementation only modifies the write data path and keeps the read path unchanged.

In some implementations, a coding scheme is used to further improve the performance of two-stage write. In some implementations, a data coding scheme is used to guarantee the number of bits with the specified value, k, of in each data block is not larger than the half size of this data block. Since write-1 stage dominates the writing for a cache line in two-stage-write, this coding scheme is applied to bit 1.

An example coding scheme is shown in Algorithm 1 below. Before writing a write unit, the number of bits with 1 (line 5) are counted. If the occurrences of bit 1 are more than half of the write unit size (line 6), all bits in this write unit are inverted (line 7). Otherwise, this write unit is kept unchanged (line 10). In this way, the number of ones to be written is less than half is the write unit size. Furthermore, in some implementations, the size of write unit of the basic two-stage-write scheme at write-1 stage can be doubled without violating the instantaneous current constraints. In some implementations, combined with basic two-stage-write introduced previously, this selective bit-wise inversion can further improve the write performance. This combined write scheme is referred to as two-stage-write-inv.

---

Algorithm 1 Data Inversion for two-stage-write

---
1:  /* N : write unit size in bits */
2:  /* I : data inversion flag */
3:  /* D: data to write */
4:  /*count the number of ones in D */
5:  cnt = get N um Of Ones(D)
6:  if cnt > N/2 then
7:      D = ~ D
8:      I = 1
9:  else
10:         I = 0
11:    end if

---

Figure 6:
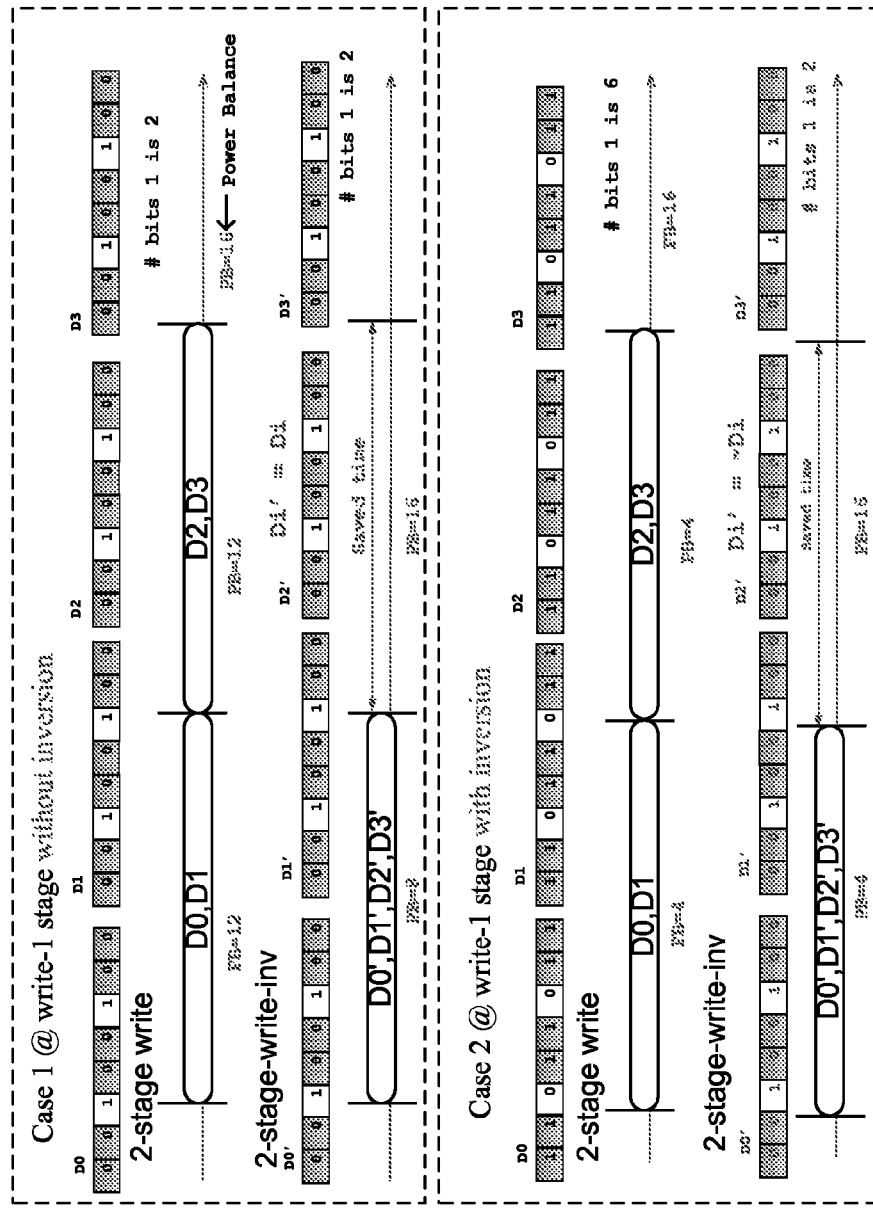
FIG. 6 is an illustration of an example of how two-stage write inversion works in the write-1 stage.

FIG. 6 illustrates an example of how 2-stage write inversion works in the write-1 stage. Assume a bank has a power budget of 16 and writing a zero bit and a one bit consume power of 2 and 1 respectively. A total of 4 bytes (D0-D3) are to be written to PCM. In the first case, assume each byte has 2 one bits. Then 2-stage write with no inversion can write 2 bytes each time even the bank has enough power balance to write more bits. Since the number of one bits in each byte in the first case is less than 4, 2-stage write inversion can write 4 bytes without violating power budget. In the second case, assume each byte has 6 one bits. Thus 4 bytes cannot be written concurrently by 2-stage write without inversion. However, 2-stage write with inversion flips the original data first and then each converted data has only 2 one bits. Accordingly, it can safely write 4 bytes to PCM without violating the power constraint.

$$T_{2stages\_inv} = \frac{N}{M}T_{reset} + \frac{N}{2ML}KT_{reset} \quad (5)$$

In some implementations, two-stage-write-inv takes less time to write a cache line than Flip-N-Write, which is one of state-of-the-art PCM write schemes. Through comparison of old data, Flip-N-Write uses a similar coding scheme to reduce the number of bits to be written by half on average if the overhead is ignored. The two-stage-write-inv adapts a different coding scheme and it reduces the number of ones to be written by half on average in the write-1 stage. Putting concrete parameters into Eqn. 4 and Eqn. 5, the time for writing a cache line under Flip-N-Write and two-stage-write-inv is calculated with an assumption of $T_{read}=T_{reset}$. Writing a cache line takes 33 Treset and 24 Treset respectively in Flip-N-Write and two-stage-write-inv. Such a simple back-of-envelop evaluation shows that two-stage-write-inv can be 27% faster.

Figure 7:
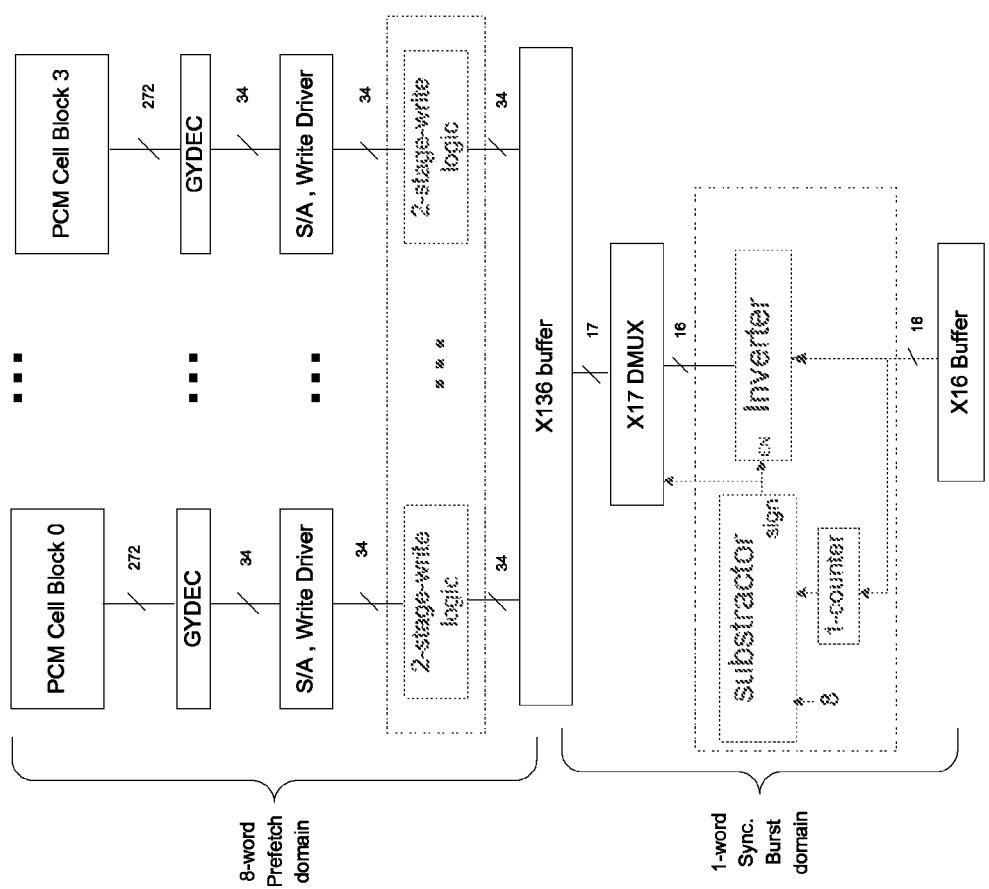
FIG. 7 is an illustration of an example two-stage-write-inv circuit.

In some implementations, two-stage-write-inv extends the implementation of two-stage-write by adding an extra circuit to examine and perform bit-wise inversion as shown in FIG. 7. Since selectively inverting data based on its number of ones, an extra cell is used to store this inversion flag for a fixed number of data bits and accordingly the a PCM chip is augmented with more bits. In the example shown below, the fixed number of bit is 16.

TABLE I

| Simulation Parameters | |
|---|---|
| Parameter | Value |
| System | 4-core CMP, 4 GHz |
| Execution Core | Alpha-like out-order processor |
| L1 Cache | 32 KB I-cache, 32 KB D-cache |
| L2 Cache | Latency 20 ns, 2 MB, 4-way, 64 B cache line |
| L3 Cache | Latency 50 ns, 32 MB, 8-way, 64 B cache line |
| Memory Controller | RIFF request scheduling algorithm, page level interleaving address mapping |
| Width of data bus | 64 bits |
| Number of Ranks | 2 |
| Number of Banks | 16 |
| Number of Chips per Bank | 4 |
| Width of a PCM Chip | 16 bits |
| Time to write a PCM cell | bit 1 430 ns, bit 0 50 ns |
| Time to read a PCM cell | 53 ns |
| Ratio of current writing bit 0 to bit 1 | 2 |
| PCM write unit size | 8 bytes |

Figure 8:
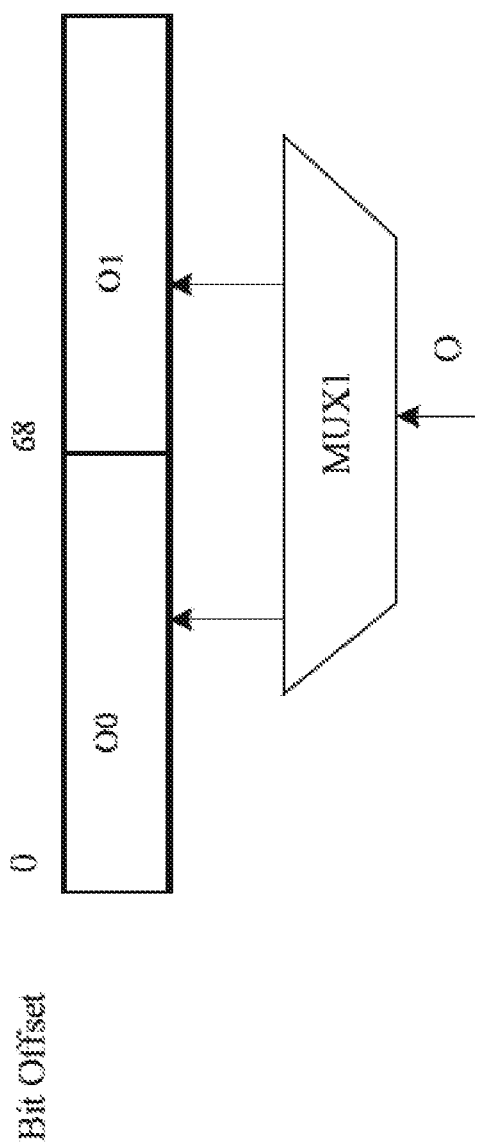
FIG. 8 is an illustration of an example multiplexer to support that two-stage-write-inv can write more bits than two-stage-write.

In some implementations, the inversion control circuit uses a counter to count the number of ones and its output is an input to a subtractor. The subtractor compares the counter and a constant of 8, which is half of the maximal parallel bits in a chip. The subtractor's sign is used to control the inversion and is also an input to ×17 DMUX to be written to PCM as an inversion flag. Two-stage-write-inv reduces the number of write operations for a cache line and the FSM in the two-stage-write logic is needed to record the write status. The selective inversion coding algorithm reduces the number of bits to be written by half on average and this reduction translates into a larger write unit size at the write-1 stage. Accordingly two minor changes are made to the two-stage-write logic. First, since the number of write units is reduced, FSM is reduced to the number of write operations in the write-1 stage and its output O. Second, the MUX1 is changed to direct data switching to support that two-stage-write-inv can write more bits than two-stage-write as shown in FIG. 8.

The performance is evaluated using the execution-driven processor simulator M5 and the cycle-level memory simulator DRAMsim, which is modified to simulate PCM. Table I shows the parameters of simulated processor and product grade PCM. In order to accurately model memory access, out-order cores are used because it produces more parallel and independent memory accesses than in-order cores. After passing through cache, memory accesses go directly to PCM. The simulated processor has four cores with 32 MB L3 cache. The PCM read and write latency are set to 57 ns and 430 ns respectively.

The PCM chip constraints are taken into account, and the PCM write unit is modeled to be 8 bytes. As a result, in conventional writing scheme, writing a cache line of 64 bytes to PCM takes 8×430 ns=3440 ns while reading a cache line needs less than 100 ns due to the chip-level pre-fetch. To tolerate slow PCM write, a large off-chip L3 DRAM cache is added. In addition, since the memory write back is not in the performance critical path, the Read Instruction and Fetch First (RIFF) scheduling algorithm is used to improve the performance.

SPEC CPU 2006 benchmark suit is used to construct 13 multi-programmed workloads with intensive memory accesses. All test applications in each workload runs in parallel and each application is fast-forwarded 15 billion instructions and then simulated 1 billion instructions. Table II summarizes memory Read Per Kilo Instructions (RPKI), memory Write Per Kilo Instructions (WPKI), Memory Level Parallelism (MLP) and Bank Level Parallelism (BLP) for each workload. RPKI and WPKI are indicators of memory access intensity of a workload and most of them are larger than 1. While the L3 cache may have 32 MB, the intensity of memory accesses measured in the workloads is very close to theirs and thus a larger L3 cache is unnecessary.

Certain embodiments of the disclosed technology are compared with the baseline scheme that uses the same parameters as listed in Table I but does not have any PCM optimization. Certain embodiments of the disclosed technology are also compared against two recently proposed PCM write optimization techniques including Write Cancellation (WC) and Flip-N-Write (FNW). Via bitwise comparison against old data, Flip-N-Write flips all bits if necessary to reduce by half on average the number of bits actually written to the PCM. Write cancellation aborts an on-going write for a newly-arriving read request targeted to the same bank if the write operation is not close to completion. When there are no read requests, all cancelled write requests will be re-executed. The static threshold value for write cancellation is set to be 75%, which was reported to be optimal under SPEC 2006. Certain embodiments of the disclosed technology are also compared against an ideal PCM whose write latency is very small (57 ns, the same as read latency), which acts as an theoretical upper bound for studying different write optimization techniques for PCM.

In the PCM simulation, the electric current to write bit 0 is two times of the current to write bit 1. Under the same instantaneous power limitation, the number of ones that can be written in parallel is two times of the number of zeros. Accordingly, the size of a write unit in the write-1 stage can be doubled, and four extra write units are needed to write a cache line of 64 bytes.

The time to write bit 0 is only ⅛ of the time to write bit 0. On average, the write-1 and write-0 stage take 4×430=1720 ns and 8×50=400 ns respectively to write a cache line under 2-stage write. As result, it takes a total of 430+1720=2120 ns in Two-stage-write. Table III summarizes the time required to write a cache line under different writing schemes.

Figure 9:
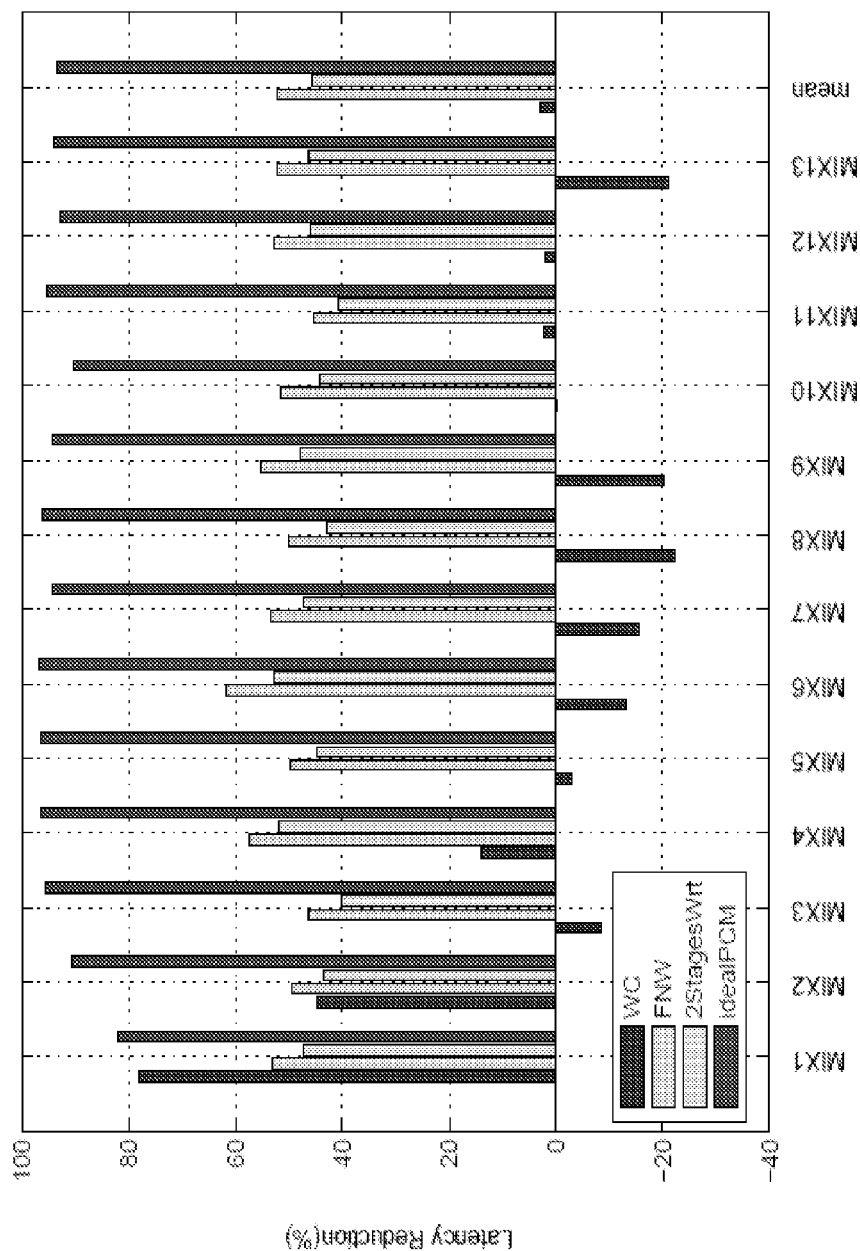
FIG. 9 is an illustration of the read latency reduction of two-stage-write and the other scheme compared with the baseline that does not have any write optimization.

FIG. 9 presents the read latency reduction of two-stage-write and the other scheme compared with the baseline that does not have any write optimization. In most of 13 workloads studied, two-stage-write can successfully reduce the read latency more than Write Cancellation (WC). On average, the read latency reduction of two-stage-write is 45.8% smaller than the baseline, while Write Cancellation and Flip-N-Write(FNW) achieve only 2.89% and 52.1% respectively.

Two-stage-write achieves a lower read latency than Write Cancellation in 10 of 13 workloads. In Write Cancellation, an on-going write still blocks read requests if it has finished more than x % of the time of writing a cache line, where x % is a predefined threshold. In experiments with a threshold of 75%, Write Cancellation can block a read request for up to 860 ns. The possibility of blocking a read increases with the more occurrences of re-execution of cancelled writes. This increases the possibility of read blocking for Write Cancellation and results in larger read latency than two-stage-write, which has no write re-executions. However, it is also noted that Write Cancellation provides the lowest read latency in the workload MIX1. This is because Write Cancellation works well if the bank level parallelism (BLP) of a workload is close to its memory level parallelism (MLP). For example, as shown in Table II, BLP and MLP are 6.02 and 8.11 respectively in MIX1. In workloads where requests are evenly distributed over different banks, Write Cancellation can reduce the possibility of re-executing cancelled writes and hence effectively reduce read latency. These workloads are referred to herein as Write Cancellation friendly workloads.

However, Write Cancellation is less effective for unfriendly workloads with remarkably different BLP and MLP. As a result, for unfriendly workloads with very different BLP and MLP, most requests are clustered to a smaller number of banks, resulting in high frequent occurrences of write cancellations. Most workloads in the experiments are Write Cancellation unfriendly and accordingly two-stage-write outperforms Write Cancellation in term of average read latency.

TABLE II

Characteristics of 13 four-core workloads

| Benchmark | Description | RPKI | WPKI | MLP | BLP |
|---|---|---|---|---|---|
| MIX1 | astar, astar, astar, astar | 7.56 | 4.73 | 8.11 | 6.02 |
| MIX2 | astar, cactusADM, libquantum, soplex | 7.68 | 3.01 | 19.77 | 3.79 |
| MIX3 | cactusADM, cactusADM, gobmk, | 3.8 | 3.58 | 71.49 | 2.85 |

TABLE II-continued

Characteristics of 13 four-core workloads

| Benchmark | Description | RPKI | WPKI | MLP | BLP |
|---|---|---|---|---|---|
| MIX4 | gobmk, gobmk, cactusADM, hmmer | 0.97 | 0.58 | 22.99 | 1.45 |
| MIX5 | gobmk, leslie3d, mcf, libquantum | 1.49 | 1.45 | 62.36 | 2.91 |
| MIX6 | gobmk, zeusmp, mcf, lbm | 4.68 | 2.48 | 64.53 | 4.294 |
| MIX7 | leslie3d, bzip2, mcf, lbm | 2.08 | 1.27 | 48.06 | 4.24 |
| MIX8 | leslie3d, gobmk, lbm, astar | 7.07 | 5.08 | 64.62 | 5.62 |
| MIX9 | leslie3d, leslie3d, soplex, soplex | 7.85 | 4.58 | 54.69 | 5.15 |
| MIX10 | leslie3d, soplex, bzip2, astar | 2.1 | 1.29 | 28.19 | 5.22 |
| MIX11 | milc, libquantum, lbm, GemsFDTD | 2.68 | 2.46 | 34.29 | 4.35 |
| MIX12 | soplex, soplex, sjeng, sjeng | 1.61 | 1.01 | 31.7 | 4.92 |
| MIX13 | soplex, soplex, soplex, soplex | 39.11 | 20.7 | 50.18 | 5.45 |

TABLE III

Service time for writing a cache line

| Conventional | Flip-N- | Two-stage- | Two-stage-write- |
|---|---|---|---|
| 3340 ns | 1773 ns | 2120 ns | 1260 ns |

Two-stage-write read latency is close to Flip-N-Write. However, two-stage-write has no storage overhead. With flipping bits, Flip-N-Write doubles the size of a write unit and reduces read latency. Flip-N-Write's performance overhead is reading the old version of data from PCM and this overhead is smaller than two-stage-writes performance overhead because in two-stage-write the writings bit 0 are executed. So the write service time for two-stage-write is 347 ns longer than Flip-N-Write shown in Table III. This 10.39% inferior to Flip-N-Write only leads to 6.3% read latency increase on average. This is because the introduction of large L3 DRAM cache can mitigate the PCM slow write's negative impact on performance. However, Flip-N-Write's performance advantage over two-stage-write needs 6.25% PCM storage space to store flipping for bits for data blocks.

Figure 10:
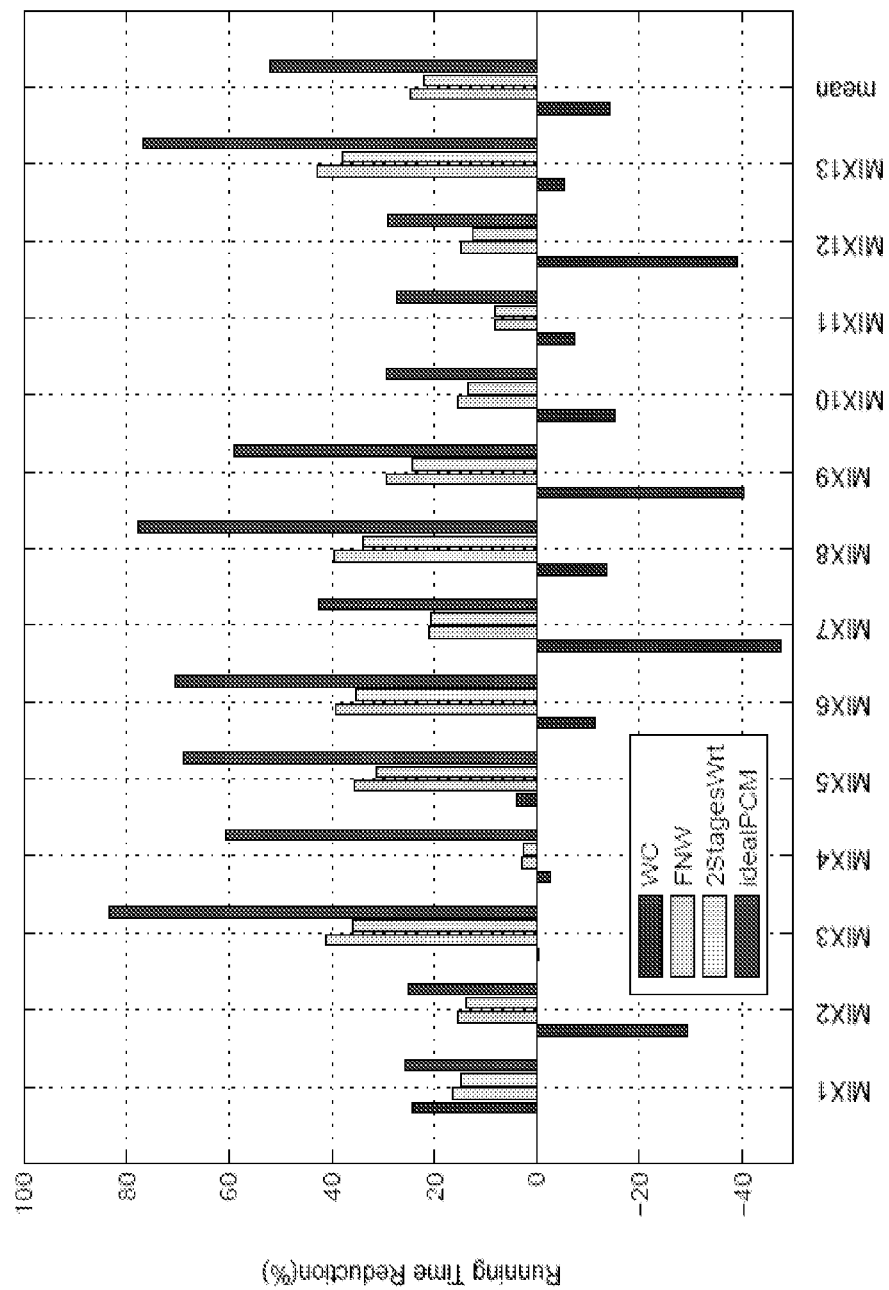
FIG. 10 is an illustration of the total running time reduction of two-stage write and other schemes when compared with a baseline.

FIG. 10 shows the total running time reduction of two-stage write and other schemes when compared with the baseline. Two-stage write's reduced read latency is directly translated into performance gain. On average, two-stage write provides 21.9% performance improvement over the baseline. The average running time of two-stage write is 2.6% longer than Flip-N-Write due to its small overhead of reading old data. It is noted that under some workloads Write Cancellation increases the total running time but has a smaller read latency than the baseline. For example in the workload MIX2, its read latency is reduced by 44.9% whereas its running time is increased by 22.5% (see FIG. 9). This is because the re-execution of cancelled writes increases the possibility of blocking read request when an executing write finishes more than 75%. On the other hand, by cancelling write requests, Write Cancellation can improve BLP. For example, the BLP of MIX5 is 3.15 and 2.91 respectively in Write Cancellation and the baseline. The performance influenced by both read latency and BLP. So this explains why MIX5's running time is reduced by 3.72% but read latency is increased by 3.09% when compared with baseline.

Figure 11:
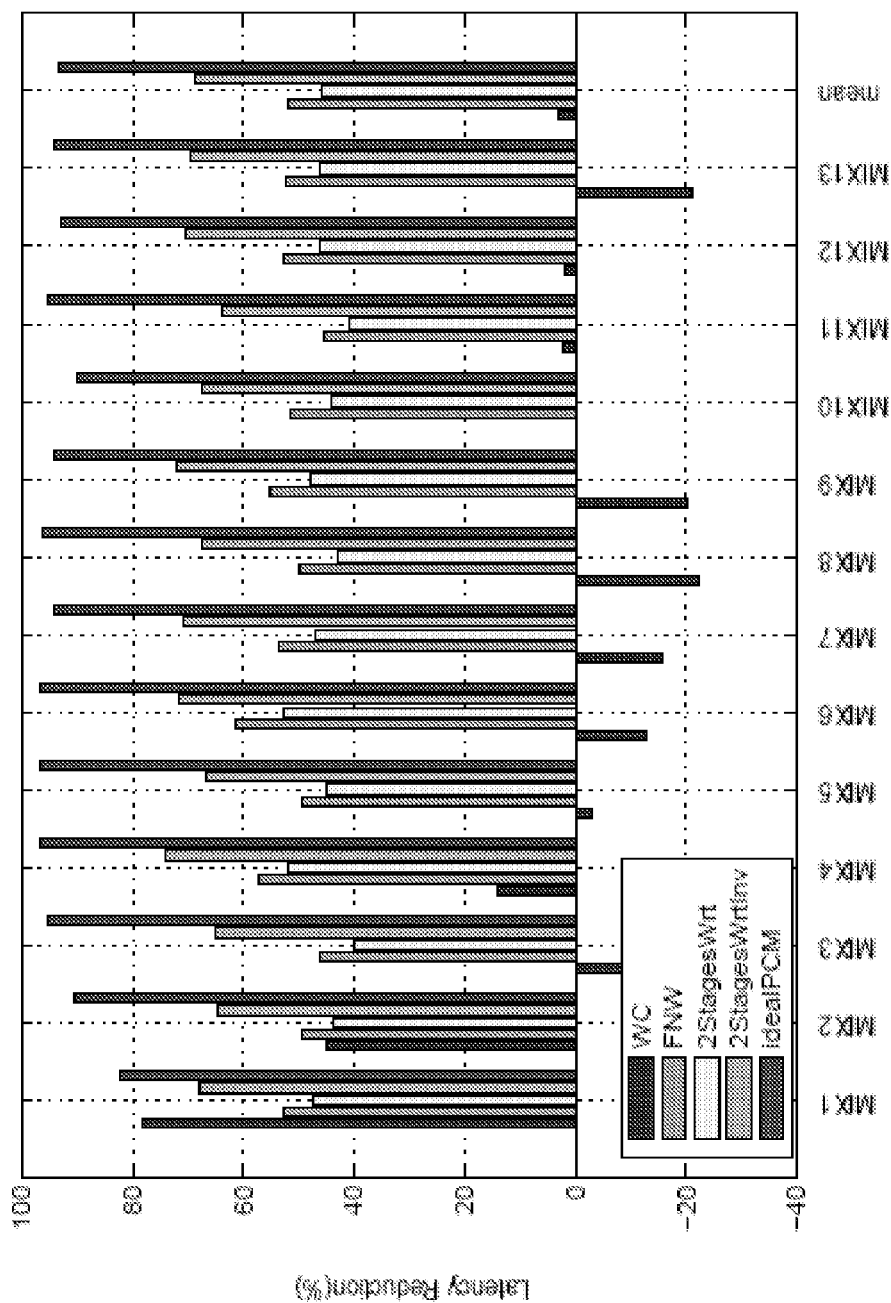
FIG. 11 is an illustration of the read latency reduction over the baseline for five schemes, including two-stage-write-inv (2StageWrfInv), two-stage-write(2stageWrt), Write Cancellation (WC), Flip-N-Write (FNW), and the ideal PCM case.

FIG. 11 compares the read latency reduction over the baseline for five schemes, including two-stage-write-inv (2StageWrtInv), two-stage-write(2stageWrt), Write Cancellation (WC), Flip-N-Write (FNW), and the ideal PCM case. The two-stage-write-inv achieves more reduction of read latency than Flip-N-Write. On average, the latency reduction for two-stage-write-inv is 68.4%, while Flip-N-Write and two-stage-write is 52.1% and 45.8% respectively. Compared with two-stage-write, the read latency of two-stage-write-inv is 22.6% less. This is because can double the size of write unit in write-1 stage and spend half time in the in the write-1 stage, which has dominated in the service time of writing a cache line. In addition, the two-stage-write-inv outperforms Flip-N-Write in term of read latency by 16.3% on average. Since the write-1 time dominates the write service time, four folds of reduction of this part can certainly help to reduce read latency more than Flip-N-Write in which the speed-up ratio is limited to 2. In sum, the two-stage-write-inv consistently outperform Flip-N-Write and the basic two-stage-write for all workloads in term of read latency.

Figure 12:
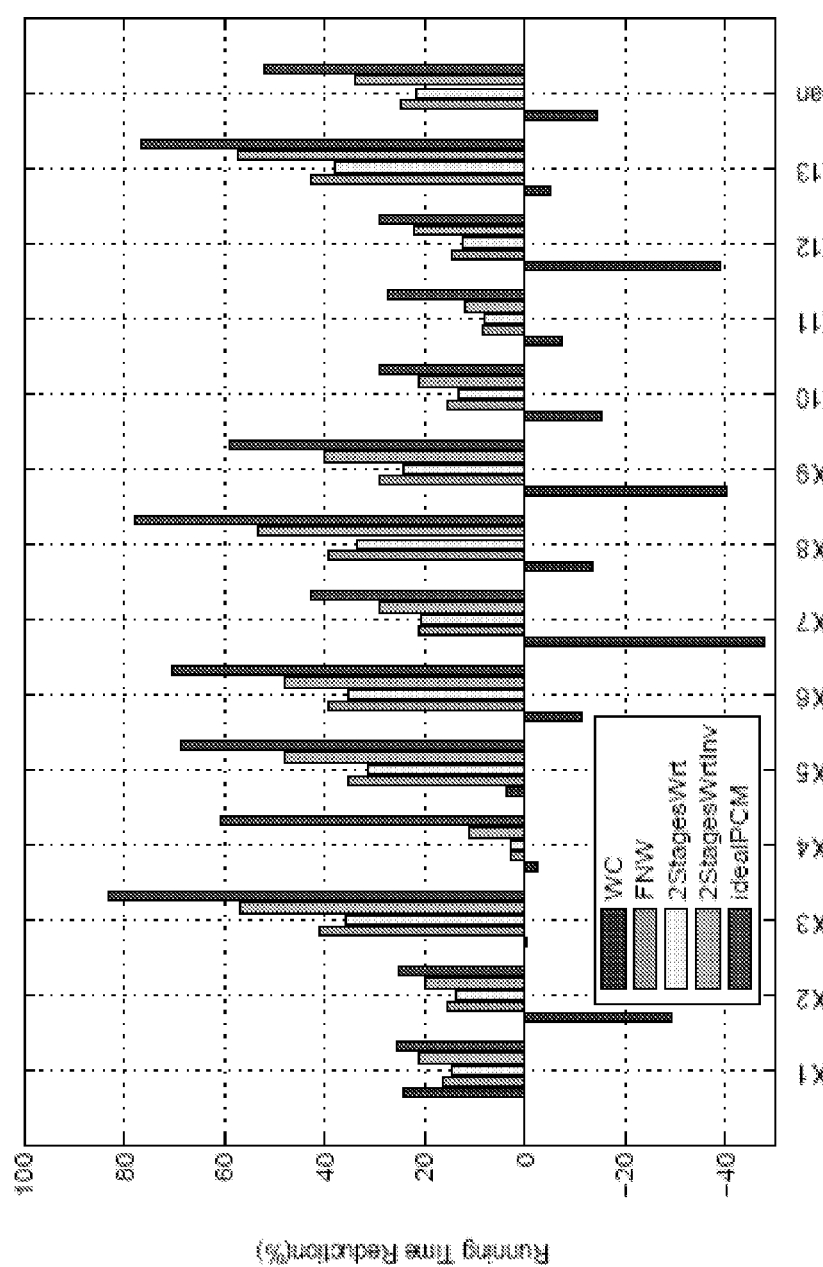
FIG. 12 is an illustration of the running time reduction of two-stage write with inversion over a baseline.

The running time reduction over the baseline is shown in FIG. 12. Since the two-stage-write-inv has a more tight write current allocation than other writing schemes through a new coding scheme, it can significantly reduce the time of writing a cache line. Under 13 workloads studied, two-stage-write-inv achieves 33.9% running time reduction over the baseline on average, and outperforms two-stage-write and Flip-N-Write by 12.9% and 9.2% respectively.

Computer Hardware and Software

It is contemplated that information in this section can be incorporated, applied, used, and/or adapted to make or use embodiments of the invention.

Figure 13:
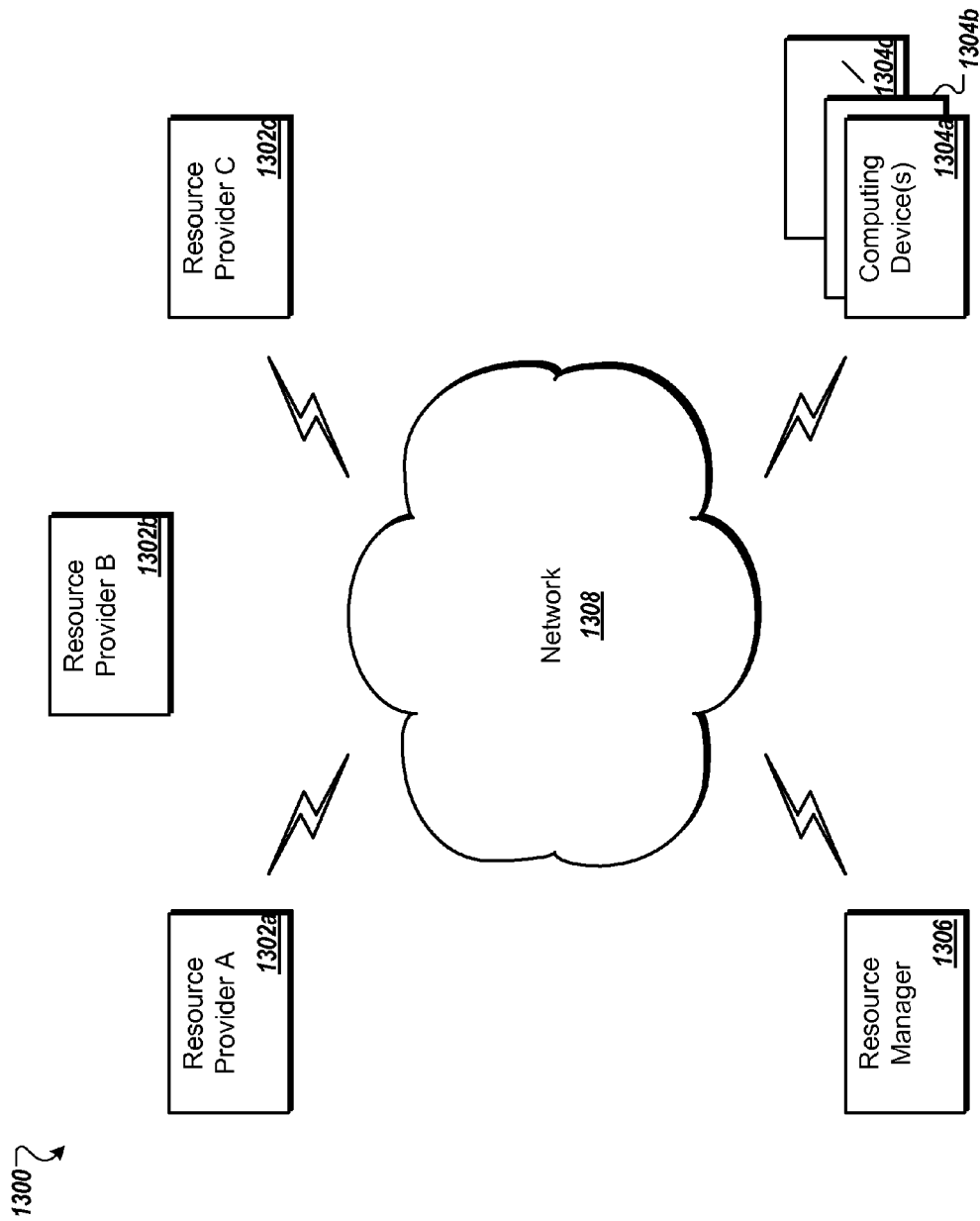
FIG. 13 illustrates a block diagram of an exemplary cloud computing environment.

As shown in FIG. 13, an implementation of a network environment 1300 for using with a device with the disclosed technology is shown and described. In brief overview, referring now to FIG. 13, a block diagram of an exemplary cloud computing environment 1300 is shown and described. The cloud computing environment 1300 may include one or more resource providers 1302a, 1302b, 1302c (collectively, 1302). Each resource provider 1302 may include computing resources. In some implementations, computing resources may include any hardware and/or software used to process data. For example, computing resources may include hardware and/or software capable of executing algorithms, computer programs, and/or computer applications. In some implementations, exemplary computing resources may include application servers and/or databases with storage and retrieval capabilities. Each resource provider 1302 may be connected to any other resource provider 1302 in the cloud computing environment 1300. In some implementations, the resource providers 1302 may be connected over a computer network 1308. Each resource provider 1302 may be connected to one or more computing device 1304a, 1304b, 1304c (collectively, 1304), over the computer network 1308.

The cloud computing environment 1300 may include a resource manager 1306. The resource manager 1306 may be connected to the resource providers 1302 and the computing devices 1304 over the computer network 1308. In some implementations, the resource manager 1306 may facilitate the provision of computing resources by one or more resource providers 1302 to one or more computing devices 1304. The resource manager 1306 may receive a request for a computing resource from a particular computing device 1304. The resource manager 1306 may identify one or more resource providers 1302 capable of providing the computing resource requested by the computing device 1304. The resource manager 1306 may select a resource provider 1302 to provide the computing resource. The resource manager 1306 may facilitate a connection between the resource provider 1302 and a particular computing device 1304. In some implementations, the resource manager 1306 may establish a connection between a particular resource provider 1302 and a particular computing device 1304. In some implementations, the resource manager 1306 may redirect a particular computing device 1304 to a particular resource provider 1302 with the requested computing resource.

Figure 14:
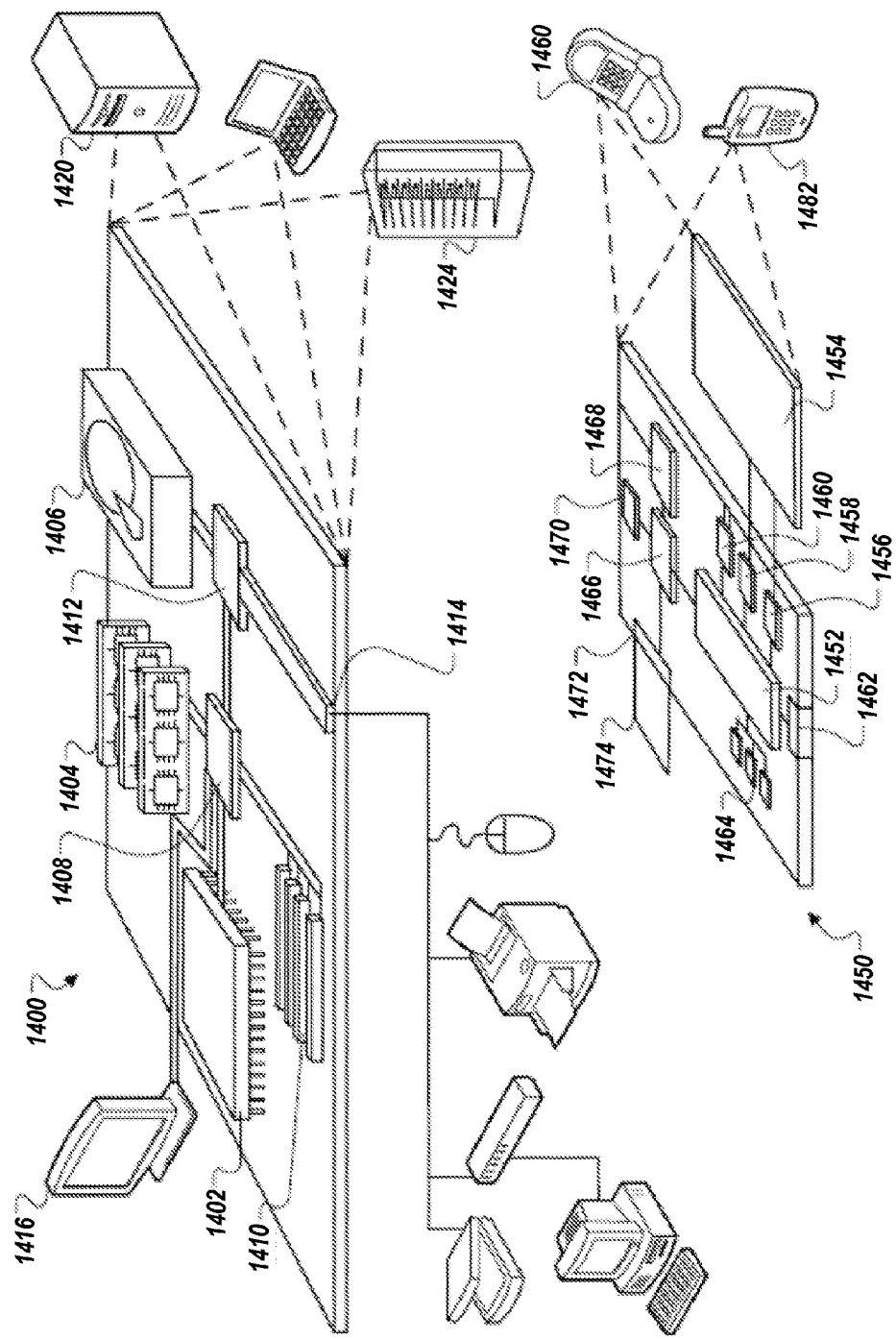
FIG. 14 is a block diagram of a computing device and a mobile computing device.

FIG. 14 shows an example of a computing device 1400 and a mobile computing device 1450 that can be used to implement the techniques described in this disclosure. The computing device 1400 is intended to represent various forms of digital computers, such as laptops, desktops, workstations, personal digital assistants, servers, blade servers, mainframes, and other appropriate computers. The mobile computing device 1450 is intended to represent various forms of mobile devices, such as personal digital assistants, cellular telephones, smart-phones, and other similar computing devices. The components shown here, their connections and relationships, and their functions, are meant to be examples only, and are not meant to be limiting.

The computing device 1400 includes a processor 1402, a memory 1404, a storage device 1406, a high-speed interface 1408 connecting to the memory 1404 and multiple high-speed expansion ports 1410, and a low-speed interface 1412 connecting to a low-speed expansion port 1414 and the storage device 1406. Each of the processor 1402, the memory 1404, the storage device 1406, the high-speed interface 1408, the high-speed expansion ports 1410, and the low-speed interface 1412, are interconnected using various busses, and may be mounted on a common motherboard or in other manners as appropriate. The processor 1402 can process instructions for execution within the computing device 1400, including instructions stored in the memory 1404 or on the storage device 1406 to display graphical information for a GUI on an external input/output device, such as a display 1416 coupled to the high-speed interface 1408. In other implementations, multiple processors and/or multiple buses may be used, as appropriate, along with multiple memories and types of memory. Also, multiple computing devices may be connected, with each device providing portions of the necessary operations (e.g., as a server bank, a group of blade servers, or a multi-processor system).

The memory 1404 stores information within the computing device 1400. In some implementations, the memory 1404 is a volatile memory unit or units. In some implementations, the memory 1404 is a non-volatile memory unit or units. The memory 1404 may also be another form of computer-readable medium, such as a magnetic or optical disk.

The storage device 1406 is capable of providing mass storage for the computing device 1400. In some implementations, the storage device 1406 may be or contain a computer-readable medium, such as a floppy disk device, a hard disk device, an optical disk device, or a tape device, a flash memory or other similar solid state memory device, or an array of devices, including devices in a storage area network or other configurations. Instructions can be stored in an information carrier. The instructions, when executed by one or more processing devices (for example, processor 1402), perform one or more methods, such as those described above. The instructions can also be stored by one or more storage devices such as computer- or machine-readable mediums (for example, the memory 1404, the storage device 1406, or memory on the processor 1402).

The high-speed interface 1408 manages bandwidth-intensive operations for the computing device 1400, while the low-speed interface 1412 manages lower bandwidth-intensive operations. Such allocation of functions is an example only. In some implementations, the high-speed interface 1408 is coupled to the memory 1404, the display 1416 (e.g., through a graphics processor or accelerator), and to the high-speed expansion ports 1410, which may accept various expansion cards (not shown). In the implementation, the low-speed interface 1412 is coupled to the storage device 1406 and the low-speed expansion port 1414. The low-speed expansion port 1414, which may include various communication ports (e.g., USB, Bluetooth®, Ethernet, wireless Ethernet) may be coupled to one or more input/output devices, such as a keyboard, a pointing device, a scanner, or a networking device such as a switch or router, e.g., through a network adapter.

The computing device 1400 may be implemented in a number of different forms, as shown in the figure. For example, it may be implemented as a standard server 1420, or multiple times in a group of such servers. In addition, it may be implemented in a personal computer such as a laptop computer 1422. It may also be implemented as part of a rack server system 1424. Alternatively, components from the computing device 1400 may be combined with other components in a mobile device (not shown), such as a mobile computing device 1450. Each of such devices may contain one or more of the computing device 1400 and the mobile computing device 1450, and an entire system may be made up of multiple computing devices communicating with each other.

The mobile computing device 1450 includes a processor 1452, a memory 1464, an input/output device such as a display 1454, a communication interface 1466, and a transceiver 1468, among other components. The mobile computing device 1450 may also be provided with a storage device, such as a micro-drive or other device, to provide additional storage. Each of the processor 1452, the memory 1464, the display 1454, the communication interface 1466, and the transceiver 1468, are interconnected using various buses, and several of the components may be mounted on a common motherboard or in other manners as appropriate.

The processor 1452 can execute instructions within the mobile computing device 1450, including instructions stored in the memory 1464. The processor 1452 may be implemented as a chipset of chips that include separate and multiple analog and digital processors. The processor 1452 may provide, for example, for coordination of the other components of the mobile computing device 1450, such as control of user interfaces, applications run by the mobile computing device 1450, and wireless communication by the mobile computing device 1450.

The processor 1452 may communicate with a user through a control interface 1458 and a display interface 1456 coupled to the display 1454. The display 1454 may be, for example, a TFT (Thin-Film-Transistor Liquid Crystal Display) display or an OLED (Organic Light Emitting Diode) display, or other appropriate display technology. The display interface 1456 may comprise appropriate circuitry for driving the display 1454 to present graphical and other information to a user. The control interface 1458 may receive commands from a user and convert them for submission to the processor 1452. In addition, an external interface 1462 may provide communication with the processor 1452, so as to enable near area communication of the mobile computing device 1450 with other devices. The external interface 1462 may provide, for example, for wired communication in some implementations, or for wireless communication in other implementations, and multiple interfaces may also be used.

The memory 1464 stores information within the mobile computing device 1450. The memory 1464 can be implemented as one or more of a computer-readable medium or media, a volatile memory unit or units, or a non-volatile memory unit or units. An expansion memory 1474 may also be provided and connected to the mobile computing device 1450 through an expansion interface 1472, which may include, for example, a SIMM (Single In Line Memory Module) card interface. The expansion memory 1474 may provide extra storage space for the mobile computing device 1450, or may also store applications or other information for the mobile computing device 1450. Specifically, the expansion memory 1474 may include instructions to carry out or supplement the processes described above, and may include secure information also. Thus, for example, the expansion memory 1474 may be provide as a security module for the mobile computing device 1450, and may be programmed with instructions that permit secure use of the mobile computing device 1450. In addition, secure applications may be provided via the SIMM cards, along with additional information, such as placing identifying information on the SIMM card in a non-hackable manner.

The memory may include, for example, flash memory and/or NVRAM memory (non-volatile random access memory), as discussed below. In some implementations, instructions are stored in an information carrier. that the instructions, when executed by one or more processing devices (for example, processor 1452), perform one or more methods, such as those described above. The instructions can also be stored by one or more storage devices, such as one or more computer- or machine-readable mediums (for example, the memory 1464, the expansion memory 1474, or memory on the processor 1452). In some implementations, the instructions can be received in a propagated signal, for example, over the transceiver 1468 or the external interface 1462.

The mobile computing device 1450 may communicate wirelessly through the communication interface 1466, which may include digital signal processing circuitry where necessary. The communication interface 1466 may provide for communications under various modes or protocols, such as GSM voice calls (Global System for Mobile communications), SMS (Short Message Service), EMS (Enhanced Messaging Service), or MMS messaging (Multimedia Messaging Service), CDMA (code division multiple access), TDMA (time division multiple access), PDC (Personal Digital Cellular), WCDMA (Wideband Code Division Multiple Access), CDMA2000, or GPRS (General Packet Radio Service), among others. Such communication may occur, for example, through the transceiver 1468 using a radio-frequency. In addition, short-range communication may occur, such as using a Bluetooth®, Wi-Fi™, or other such transceiver (not shown). In addition, a GPS (Global Positioning System) receiver module 1470 may provide additional navigation- and location-related wireless data to the mobile computing device 1450, which may be used as appropriate by applications running on the mobile computing device 1450.

The mobile computing device 1450 may also communicate audibly using an audio codec 1460, which may receive spoken information from a user and convert it to usable digital information. The audio codec 1460 may likewise generate audible sound for a user, such as through a speaker, e.g., in a handset of the mobile computing device 1450. Such sound may include sound from voice telephone calls, may include recorded sound (e.g., voice messages, music files, etc.) and may also include sound generated by applications operating on the mobile computing device 1450.

The mobile computing device 1450 may be implemented in a number of different forms, as shown in the figure. For example, it may be implemented as a cellular telephone 1480. It may also be implemented as part of a smart-phone 1482, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms machine-readable medium and computer-readable medium refer to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term machine-readable signal refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network (LAN), a wide area network (WAN), and the Internet.

The computing system can include clients and servers. A client and server are generally remote from each other and typically interact through a communication network. The relationship of client and server arises by virtue of computer programs running on the respective computers and having a client-server relationship to each other.

In view of the structure, functions and apparatus of the systems and methods described here, in some implementations, a system and method for writing schemes are provided. Having described certain implementations of methods and apparatus for supporting the writing schemes, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the present invention that consist essentially of, or consist of, the recited components, and that there are processes and methods according to the present invention that consist essentially of, or consist of, the recited processing steps.

It should be understood that the order of steps or order for performing certain action is immaterial so long as the invention remains operable. Moreover, two or more steps or actions may be conducted simultaneously.

What is claimed:

1. A phase-change memory (PCM) chip comprising a circuit, wherein the circuit comprises:
   a buffer, the buffer configured to store one or more bits and to output a buffer signal;
   a finite states machine (FSM), the FSM configured to provide an output control, a first write-region control, and a second write-region control, wherein the first and second write-region controls specify which write-region is scheduled;
   a first AND gate, the first AND gate configured to receive the output control, the first write-region control, and an inverted buffer signal, wherein the inverted buffer signal is an inversion of the buffer signal output by the buffer;
   a second AND gate, wherein the second AND gate is configured to receive the buffer signal, the second write-region control, and an inversion of the output control;
   an OR gate, wherein the OR gate is configured to receive an output signal of the first AND gate and an output signal of the second AND gate; and
   a switch, the switch configured to provide the buffer signal to a write driver according to an output signal of the OR gate, wherein the write driver writes one or more bits stored in the buffer in the target cache line;
   wherein the circuit is configured to schedule writing requests in at least two stages, wherein a first stage comprises writing all bits of zero in a target cache line and a second stage comprises writing all bits of one in the target cache line.

2. The PCM chip of claim 1, wherein the first stage precedes the second stage.

3. The PCM chip of claim 1, comprising a control circuit, wherein the control circuit is configured to:
   identify a number of ones in a write unit to be written in the target cache line;
   determine that the number of ones in the write unit exceeds half of the write unit size;
   based on the determining step, (a) invert all of the bits in the write unit, and (b) store an inversion flag associated with the write unit;
   wherein the bits are inverted and the inversion flag is associated prior to the first stage and the second stage.

4. The PCM chip of claim 1, wherein the first stage comprises writing the bits of zero sequentially.

5. The PCM chip of claim 1, wherein the second stage comprises writing one or more bits of one in parallel.

6. The PCM chip of claim 3, wherein the circuit comprises the control circuit.

7. The PCM chip of claim 1, wherein the PCM chip is a single-level-cell (SLC) chip.

8. A phase-change memory (PCM) chip comprising:
   a circuit, the circuit configured to schedule writing requests in at least two stages, wherein a first stage of the at least two stages comprises writing all bits of zero in a target cache line and a second stage of the at least two stages comprises writing all bits of one in the target cache line; and
   a control circuit, wherein the control circuit is configured to:
   identify a number of ones in a write unit to be written in the target cache line;
   determine if the number of ones in the write unit exceeds half of the write unit size, and
   based upon the determining step, (a) invert all of the bits in the write unit, and (b) store an inversion flag associated with the write unit, wherein the bits are inverted and the inversion flag is associated prior to the first stage and the second stage.

9. The PCM chip of claim 8, wherein the first stage precedes the second stage.

10. The PCM chip of claim 8, wherein the first stage comprises writing the bits of zero sequentially.

11. The PCM chip of claim 8, wherein the second stage comprises writing one or more bits of one in parallel.

12. The PCM chip of claim 8, wherein the circuit comprises the control circuit.

13. The PCM chip of claim 8, wherein the PCM chip is a single-level-cell (SLC) chip.

* * * * *